(12) United States Patent
Wang et al.

(10) Patent No.: US 11,971,662 B2
(45) Date of Patent: Apr. 30, 2024

(54) DIGITAL EXPOSURE MACHINE AND EXPOSURE CONTROL METHOD THEREOF

(71) Applicant: BOE TECHNOLOGY GROUP CO., LTD., Beijing (CN)

(72) Inventors: Zhichong Wang, Beijing (CN); Fuqiang Li, Beijing (CN); Peng Liu, Beijing (CN); Jing Feng, Beijing (CN); Xinglong Luan, Beijing (CN); Guangcai Yuan, Beijing (CN); Xue Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 791 days.

(21) Appl. No.: 17/083,979

(22) Filed: Oct. 29, 2020

(65) Prior Publication Data

US 2021/0132501 A1 May 6, 2021

(30) Foreign Application Priority Data

Oct. 30, 2019 (CN) .......................... 201911047306.1

(51) Int. Cl.
*G03F 7/00* (2006.01)
*G03F 7/20* (2006.01)
*G03F 7/22* (2006.01)

(52) U.S. Cl.
CPC .............. *G03F 7/22* (2013.01); *G03F 7/2051* (2013.01); *G03F 7/70466* (2013.01); *G03F 7/70475* (2013.01)

(58) Field of Classification Search
CPC ...... G03F 7/22; G03F 7/2051; G03F 7/70466; G03F 7/2053; G03F 7/70383; G03F 7/70;
(Continued)

(56) References Cited

U.S. PATENT DOCUMENTS

| 2004/0075882 | A1* | 4/2004 | Meisburger | ......... G03F 7/70558 |
| | | | | 359/290 |
| 2008/0241486 | A1* | 10/2008 | Ishikawa | ............. G03F 7/70475 |
| | | | | 430/30 |
| 2021/0389682 | A1* | 12/2021 | Luan | .................... G03F 7/70358 |

FOREIGN PATENT DOCUMENTS

JP            2012073420 A   *   4/2012

OTHER PUBLICATIONS

English translation of JP2012-073420, published Apr. 12, 2012. (Year: 2012).*

* cited by examiner

*Primary Examiner* — Christina A Riddle
(74) *Attorney, Agent, or Firm* — Kinney & Lange, P.A.

(57) ABSTRACT

A digital exposure machine and an exposure control method thereof are disclosed. The exposure control method of the digital exposure machine includes: determining a scanning direction of the digital exposure machine, wherein a plurality of sub-pixels in an array include multiple rows of sub-pixels arranged in the scanning direction, the multiple rows of sub-pixels including a first row of sub-pixels in the scanning direction; determining a starting scanning position, the starting scanning position being located on an outer side of the first row of sub-pixels in the scanning direction; and performing a plurality of scannings to expose a display region of the first display substrate to be exposed, wherein a scanning pitch for each of the plurality of scannings is integer times of a pitch of two adjacent rows of sub-pixels of the first display substrate in the scanning direction.

16 Claims, 17 Drawing Sheets

(58) Field of Classification Search
CPC .............. G03F 7/70425; G03F 7/7043; G03F 7/70475; G03F 7/70483–70541; G03F 7/70291; G03F 7/70325; G03F 7/70358; G03F 7/704; G03F 7/70791; G03F 7/20; G03F 7/2002; G03F 7/2004; G03F 7/2057; G02F 1/13621; G02F 1/13625; G02F 1/133516
USPC .... 355/18, 30, 52–55, 67–77; 430/5, 22, 30; 250/492.1, 492.2, 492.22, 492.23, 493.1, 250/494.1, 503.1, 504 R, 505.1
See application file for complete search history.

performing a plurality of scannings to expose a display region of the first display substrate to be exposed starting from an outer side of a first row of the sub-pixels in a scanning direction of the digital exposure machine, wherein a scanning pitch used in each scanning is integer times of a pitch of two adjacent rows of sub-pixels of the first display substrate to be exposed in the scanning direction ⸺ S101

FIG.1

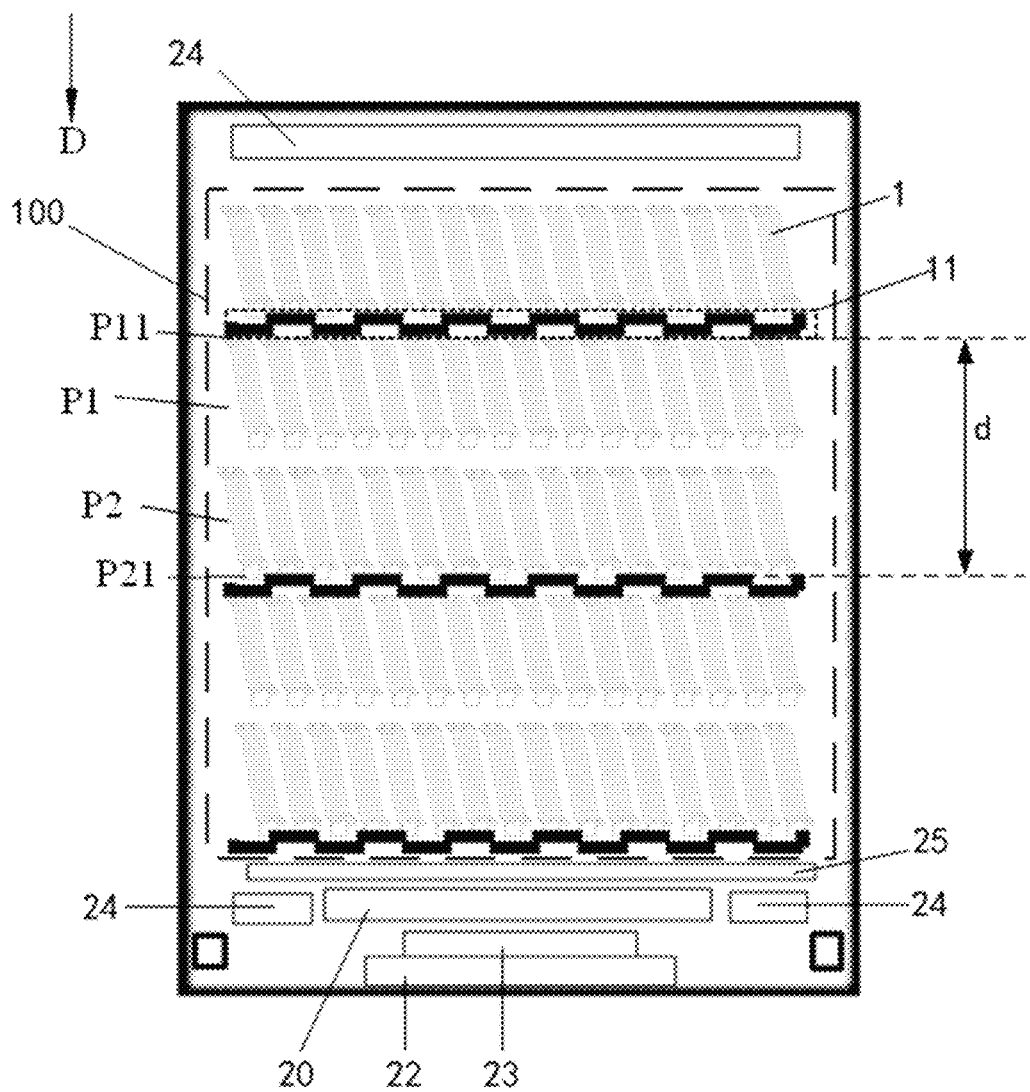

FIG.2

DIGITAL EXPOSURE MACHINE AND EXPOSURE CONTROL METHOD THEREOF

CROSS-REFERENCE TO RELATED APPLICATION

This application claims the benefit of Chinese Patent Application No. 201911047306.1 filed on Oct. 30, 2019 in the China National Intellectual Property Administration, the whole disclosure of which is incorporated herein by reference.

TECHNICAL FIELD

The present disclosure relates to the technical field of exposure technologies, especially to a digital exposure machine and an exposure control method thereof.

BACKGROUND

Thin film transistor liquid crystal displays (abbreviated as TFT-LCDs) are widely applied in electric display products such as mobile phones, computers, TV(television)s, Monitor (display)s due to advantages of light weight, low consumption, high definition, etc. With explosive developments of VR (virtual reality) and mobile phones in recent years, TFT-LCDs are developing for a high PPI (pixels per inch) and thinner design, which requires TFT-LCDs to reduce the pixel size and the pixel pitch continuously to meet the requirement of high PPI. Further, the reduced pixel size is mainly achieved by reducing the critical dimension (abbreviated as CD) of the thin film transistor.

SUMMARY

In an aspect, an exposure control method of a digital exposure machine applied to a display mother board to be exposed is provided, the display mother board to be exposed comprising at least a first display substrate to be exposed, the first display substrate to be exposed comprising a plurality of sub-pixels arranged in an array, wherein the exposure control method comprises: determining a scanning direction of the digital exposure machine, wherein the plurality of sub-pixels comprise multiple rows of sub-pixels arranged in the scanning direction, and the multiple rows of sub-pixels comprise a first row of sub-pixels in the scanning direction; determining a starting scanning position, the starting scanning position being located on an outer side of the first row of sub-pixels in the scanning direction; and performing a plurality of scannings to expose a display region of the first display substrate to be exposed, wherein a scanning pitch for each of the plurality of scannings is integer times of a pitch of two adjacent rows of sub-pixels of the first display substrate in the scanning direction.

According to some exemplary embodiments of the present disclosure, the plurality of scannings comprise a first scanning, a first scanned region is a region which is scanned in the first scanning; before the first scanning, the exposure control method further comprises: providing a plurality of auxiliary layers, wherein the plurality of auxiliary layers correspond to a plurality of scanned regions respectively, and the plurality of auxiliary layers associate with a plurality of exposure programs respectively; identifying an auxiliary layer corresponding to the first scanned region; and determining a first exposure program associated with the auxiliary layer corresponding to the first scanned region, wherein, in the first exposure program, the scanning pitch is set to be integer times of the pitch of two adjacent rows of sub-pixels of the first display substrate in the scanning direction.

According to some exemplary embodiments of the present disclosure, the display mother board to be exposed further comprises a second display substrate to be exposed, the second display substrate to be exposed comprises a display region; and the second display substrate to be exposed is adjacent to the first display substrate to be exposed in the scanning direction; in the scanning direction, there is an overlapped region between two adjacent auxiliary layers, the overlapped region corresponds to a region between the display region of the first display substrate to be exposed and the display region of the second display substrate to be exposed.

According to some exemplary embodiments of the present disclosure, the plurality of scannings further comprise a second scanning, and a second scanned region is a region which is scanned in the second scanning; after the first scanning, the exposure control method further comprises: judging whether the second scanned region corresponds to the overlapped region; and switching the first exposure program to a second exposure program associated with the overlapped region in response to the second scanned region corresponding to the overlapped region, wherein in the second exposure program, a distance between the display region of the first display substrate to be exposed and the display region of the second display substrate to be exposed in the scanning direction is set to be integer times of the scanning pitch.

According to some exemplary embodiments of the present disclosure, a third exposure program associated with an auxiliary layer corresponding to the second scanned region is used to perform the second scanning in response to the second scanned region not corresponding to the overlapped region, wherein in the third exposure program, the scanning pitch is set to be integer times of the pitch of two adjacent rows of sub-pixels of the first display substrate in the scanning direction.

According to some exemplary embodiments of the present disclosure, after the first exposure program has been switched into the second exposure program, the exposure control method further comprises: performing the second exposure program to scan the second scanned region.

According to some exemplary embodiments of the present disclosure, after performing the second exposure program to scan the second scanned region, the exposure control method further comprises: judging whether the currently scanned region corresponds to an auxiliary layer which corresponds to a region to be exposed of the second display substrate to be exposed; and switching the second exposure program to a fourth exposure program associated with the auxiliary layer corresponding to the currently scanned region in response to the currently scanned region corresponding to the auxiliary layer which corresponds to the region to be exposed of the second display substrate to be exposed, wherein in the fourth exposure program, the scanning pitch is set to be integer times of a pitch of two adjacent rows of sub-pixels of the second display substrate to be exposed in the scanning direction.

According to some exemplary embodiments of the present disclosure, a fifth exposure program associated with the overlapped region corresponding to the currently scanned region is used to scan the currently scanned region in response to the currently scanned region not corresponding to the auxiliary layer which corresponds to the region to be exposed of the second display substrate to be exposed, wherein in the fifth exposure program, a distance between the display region of the first display substrate to be exposed and the display region of the second display substrate to be exposed in the scanning direction is set to be integer times of the scanning pitch.

According to some exemplary embodiments of the present disclosure, after the second exposure program has been switched into the fourth exposure program, the exposure control method further comprises: performing the fourth exposure program to scan the currently scanned region.

In another aspect, a digital exposure machine applied to a display mother board to be exposed is provided, the display mother board to be exposed comprising at least a first display substrate to be exposed, the first display substrate to be exposed comprising a plurality of sub-pixels arranged in an array, wherein the digital exposure machine comprises: a scanning module, configured to perform a plurality of scannings with a start at an outer side of a first row of the sub-pixels in a scanning direction of the digital exposure machine, to expose a display region of the first display substrate to be exposed, wherein a scanning pitch used in each of the plurality of scannings is integer times of a pitch of two adjacent rows of sub-pixels of the first display substrate to be exposed in the scanning direction.

According to some exemplary embodiments of the present disclosure, the plurality of scannings comprise a first scanning, and a first scanned region is a region which is scanned in the first scanning; the digital exposure machine further comprises: a setting module, configured to provide a plurality of auxiliary layers, wherein the plurality of auxiliary layers correspond to a plurality of scanned regions respectively, and the plurality of auxiliary layers associate with a plurality of exposure programs respectively; an identifying module, configured to identify the auxiliary layer corresponding to the first scanned region; and a determination module, configured to determine a first exposure program associated with the auxiliary layer corresponding to the first scanned region, wherein in the first exposure program, the scanning pitch is set to be integer times of the pitch of two adjacent rows of sub-pixels of the first display substrate to be exposed in the scanning direction.

According to some exemplary embodiments of the present disclosure, the display mother board to be exposed further comprises a second display substrate to be exposed; the second display substrate to be exposed is adjacent to the first display substrate to be exposed in the scanning direction; there is an overlapped region between two adjacent auxiliary layers in the scanning direction, and the overlapped region corresponds to a region between a display region of the first display substrate to be exposed and a display region of the second display substrate to be exposed, wherein the plurality of scannings further comprise a second scanning, and a second scanned region is a region which is scanned in the second scanning; wherein the digital exposure machine further comprises: a first judging module, configured to judge whether the second scanned region corresponds to the overlapped region; and a first switching module, configured to switch the first exposure program to a second exposure program associated with the overlapped region in response to the second scanned region corresponding to the overlapped region; wherein in the second exposure program, a distance between the display region of the first display substrate to be exposed and the display region of the second display substrate to be exposed is set to be integer times of the scanning pitch.

According to some exemplary embodiments of the present disclosure, the scanning module is also configured to: perform a third exposure program associated with the auxiliary layer corresponding to the second scanned region for the second scanning, in response to the second scanned region not corresponding to the overlapped region, wherein in the third exposure program, the scanning pitch is set to be integer times of the pitch of two adjacent rows of sub-pixels of the first display substrate to be exposed in the scanning direction.

According to some exemplary embodiments of the present disclosure, the scanning module is also configured to: perform the second exposure program to scan the second scanned region.

According to some exemplary embodiments of the present disclosure, the digital exposure machine further comprises: a second judging module, configured to judge whether the currently scanned region corresponds to the auxiliary layer corresponding to the region to be exposed of the second display substrate to be exposed; and a second switching module, configured to switch the second exposure program to a fourth exposure program associated with the auxiliary layer corresponding to the currently scanned region, in response to the currently scanned region corresponding to the auxiliary layer corresponding to the region to be exposed of the second display substrate to be exposed; wherein in the fourth exposure program, the scanning pitch is set to be integer times of the pitch of two adjacent rows of sub-pixels of the second display substrate to be exposed in the scanning direction.

According to some exemplary embodiments of the present disclosure, the scanning module is also configured to: in response to the currently scanned region not corresponding to the auxiliary layer which corresponds to the region to be exposed of the second display substrate to be exposed, perform a fifth exposure program associated with the overlapped region corresponding to the currently scanned region to scan the currently scanned region, wherein in the fifth exposure program, the distance between the display region of the first display substrate to be exposed and the display region of the second display substrate to be exposed is set to be integer times of the scanning pitch.

BRIEF DESCRIPTION OF THE DRAWINGS

In order to explain the embodiments of the present disclosure or the technical solutions in the prior art more clearly, brief introductions will be made to the drawings needed in the description of the embodiments or the prior art. Obviously, the drawings described below are only some embodiments of the present disclosure, for those of ordinary skill in the art, other drawings can be obtained based on these drawings without creative work.

FIG. 1 is a schematic flow chart of an exposure control method of a digital exposure machine according to embodiments of the present disclosure;

FIG. 2 is a schematic structure diagram of a first display substrate to be exposed according to the embodiments of the present disclosure;

DETAILED DESCRIPTION OF EMBODIMENTS

Figure 3:
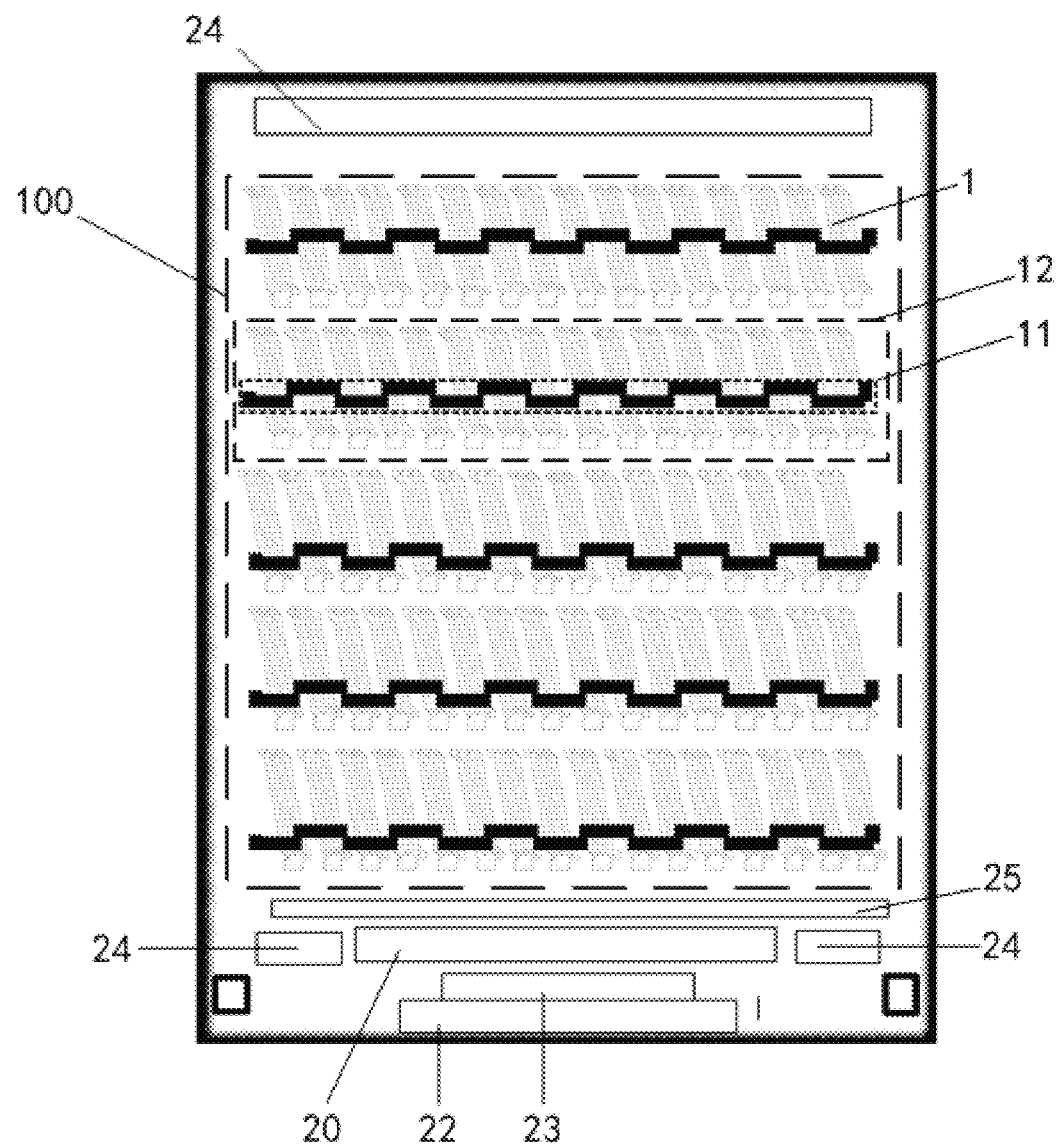
FIG. 3 is a schematic structure diagram of another first display substrate to be exposed according to the embodiments of the present disclosure.

Technical solutions of embodiments of the present disclosures will be described below clearly and completely with reference to the drawings of the embodiments, it is obvious that the embodiments described are merely a part of the embodiments of the present disclosure, rather than all the embodiments. Based on the embodiments of the present disclosure, all other embodiments which may be obtained by those skilled in the art without creative work fall within the protecting scope of the present disclosure.

In order to facilitate the clear description of the technical solutions of the embodiments of the present disclosure, in the embodiments of the present disclosure, words such as "first", "second" . . . "fifth" are configured to distinguishing the same items or similar items that have basically the same function and effect, and those skilled in the art can understand that the words "first", "second" . . . "fifth" do not limit the quantity and execution order.

It should be noted that, the core technology for making TFTs is photolithography. A sub-process of a photolithography process uses one mask, including: cleaning, film forming, coating, exposure, developing, PR (photoresist) stripping, etching, inspecting and other processes. Wherein, the exposure process may directly affect the critical dimension of the TFT.

For example, in the photolithography process, a design layout pattern is transformed into a physical mask, then ultraviolet light irradiates onto the mask and passes through gaps between patterns of the mask so as to optically react with photoresist, thereby transferring the patterns of the mask onto a glass substrate. With the development of technology, digital lithography technology is applied. In the digital lithography process, the design layout pattern is transformed into a virtual mask, and the virtual mask is transferred onto the glass substrate by a digital exposure machine.

The critical dimension of TFT is getting smaller and smaller due to the requirement of high PPI, thus, when the digital exposure machine is used to expose a display substrate, an overlapped region between two adjacent laser scannings is easy to fall within a region in which pixel patterns are located, which leads to misalignment and positional splicing difference in the exposed pixel patterns. As a result, a difference in critical dimension of various TFTs (that is, a CD difference) may be produced. The difference in critical dimension of TFTs directly affect a light transmission area of various pixels, thereby affecting the uniformity of luminous flux in one aspect; and affect the drive circuit of TFT, thereby affecting the deflection of liquid crystal and in turn leading to greater differences between luminous fluxes in another aspect. The two aspects eventually lead to periodic MURA (uneven light and dark) phenomenon in the display panel during the display process, thereby reducing the display effect.

The embodiments of the present disclosure provide a digital exposure machine and an exposure control method thereof. As described above, the overlapped region between two adjacent laser scannings may fall within a region in which pixel patterns are located, which leads to misalignment and positional splicing difference in the exposed pixel patterns. By means of the exposure control method according to the embodiments of the present disclosure, the misalignment and the positional splicing difference of the exposed pixel patterns may be avoided, thereby reducing the difference in critical dimension of TFT significantly. In this way, the periodic MURA phenomenon is reduced, the display effect is improved, and the quality of the display panel is also improved.

The embodiments of the present disclosure provide an exposure control method of a digital exposure machine applied to a display mother board to be exposed. The display mother board to be exposed comprises at least a first display substrate to be exposed, the first display substrate to be exposed comprises a plurality of sub-pixels arranged in an array. The exposure control method comprises: performing a plurality of scannings with a start at an outer side of a first row of the sub-pixels in a scanning direction of the digital exposure machine, to expose a display region of the first display substrate to be exposed, wherein a scanning pitch used in each scanning is integer times of a pitch of two adjacent rows of sub-pixels of the first display substrate to be exposed in the scanning direction. In this way, the overlapped region between two adjacent scannings may fall within a region between two adjacent rows of sub-pixels, and patterns are not provided in the region between two adjacent rows of sub-pixels, so that the region between two adjacent rows of sub-pixels is an ineffective pattern region.

In this way, it is possible to avoid the misalignment and the positional splicing difference of the exposed pixel patterns which may otherwise be caused due to the overlapped region of two adjacent scannings falling within the region in which the pixel patterns are located, thereby reducing the difference in the critical dimension of TFT significantly. In this way, the periodic MURA phenomenon is reduced, the display effect is improved, and the quality of the display panel is also improved.

The embodiments of the present disclosure provide a digital exposure applied to a display mother board to be exposed. The display mother board to be exposed comprises at least a first display substrate to be exposed, and the first display substrate to be exposed comprises a plurality of sub-pixels arranged in an array. The digital exposure machine comprises: a scanning module, configured to perform a plurality of scannings with a start at an outer side of a first row of the sub-pixels in a scanning direction of the digital exposure machine, to expose a display region of the first display substrate to be exposed, wherein a scanning pitch used in each scanning is integer times of a pitch of two adjacent rows of sub-pixels of the first display substrate to be exposed in the scanning direction. The display substrate exposed by the digital exposure machine avoid the misalignment and the positional splicing difference of the exposed pixel patterns which may otherwise be caused due to the overlapped region of two adjacent scannings falling within the region in which the pixel patterns are located, thereby reducing the difference in the critical dimension of TFT significantly. In this way, the periodic MURA phenomenon is reduced, the display effect is improved, and the quality of the display panel is also improved.

Some exemplary embodiments of the present disclosure provide an exposure control method of a digital exposure machine applied to a display mother board to be exposed, the display mother board to be exposed comprises at least a first display substrate to be exposed, and the first display substrate to be exposed comprises a plurality of sub-pixels arranged in an array. As shown in FIG. 1, the exposure control method comprises a step S101.

In the step S101, a plurality of scannings are performed with a start at an outer side of a first row of sub-pixels in a scanning direction of the digital exposure machine, to exposure a display region of the first display substrate to be exposed, wherein a scanning pitch used in each scanning is integer times of a pitch of two adjacent rows of sub-pixels of the first display substrate to be exposed in the scanning direction.

In some embodiments, the display mother board to be exposed may comprise only the first display substrate to be exposed, or the display mother board to be exposed may comprise other (equal to or more than two) display substrates to be exposed, which is determined according to the dimension of the display substrate to be exposed.

With reference to FIG. 2, the first display substrate to be exposed comprises a plurality of sub-pixels 1 arranged in an array, wherein at least three adjacent sub-pixels may constitute a pixel. For example, the three adjacent sub-pixels may be a red sub-pixel, a green sub-pixel, a blue sub-pixel, thereby constituting a pixel; or four adjacent sub-pixels may be a red sub-pixel, a green sub-pixel, a blue sub-pixel and a white sub-pixel, thereby constituting a pixel. The embodiments of the present disclosure do not limit this.

The embodiments of the present disclosure do not limit the type of the first display substrate to be exposed. For example, the first display substrate to be exposed may be a color filter substrate, which may be aligned and assembled with an array substrate to form a liquid crystal display panel. Alternatively, the first display substrate to be exposed may be an array substrate, which may be aligned and assembled with a color film substrate to form a liquid crystal display panel. Alternatively, the first display substrate to be exposed may be a base substrate, on which thin film transistors, OLED (organic light emitting diode), and the like may be disposed, and the base substrate may be aligned and assembled with an encapsulating substrate to form an OLED display panel.

The first display substrate to be exposed may be divided into a display region (active area, abbreviated as AA) 100 and a non-display region surrounding the display region, as shown in FIG. 2. With reference to FIG. 2, the plurality of sub-pixels 1 arranged in an array are located in the display region 100. The non-display region may comprise a fanout region 20, a FPC (flexible printed circuit) 22, an IC (integrated circuit) 23, an ESD (electro static discharge) region 24, a MUX (multiplexer) 25, and the like. The embodiments of the present disclosure only specify structures and film layers associated with the inventive concept of the present disclosure, and other structures and film layers will not be repeated here.

As stated above, the scanning pitch used in each scanning is integer times of the pitch of two adjacent rows of sub-pixels of the first display substrate to be exposed in the scanning direction. It should be noted that, in the article, the expression "scanning pitch" means a size of a part of the display substrate, which is exposed in one scanning, in the scanning direction. In addition, with reference to FIG. 2, the pitch d of two adjacent rows of sub-pixels indicate a distance between an upper end of a current row of sub-pixels and a lower end of adjacent row of sub-pixels. For example, in FIG. 2, the scanning direction may be the direction D downwardly in the drawing, the two adjacent rows of sub-pixels may comprise a first row of sub-pixels P1 and a second row of sub-pixels P2 arranged in the scanning direction D, the first row of sub-pixels P1 may comprise a first side P11 away from the second row of sub-pixels in the scanning direction D, the second row of sub-pixels P2 may comprise a second side P21 away from the first row of sub-pixels in the scanning direction D, and the pitch of two adjacent rows of sub-pixels may indicate a distance between the first side P11 and the second side P21 in the scanning direction D, that is the distance d in FIG. 2.

It should be noted that the expression "integer times" here may be one time, two times, three times, etc., the specific time is determined according to the resolution of the digital exposure machine and the size of the first display substrate to be exposed. FIG. 2 is an example in which the scanning pitch is one time the pitch of two adjacent rows of sub-pixels of the first display substrate to be exposed in the scanning direction.

The scanning pitch in each scanning described above may be the same as or different from the scanning pitch in another scanning, which is not limited in the embodiments of the present disclosure. In consideration of reducing the complexity of the exposure control method, the scanning pitches in various scannings described above may be the same. The specific rays in each scanning described above are not limited. For example, a laser may be used for scanning.

It should be noted that, in the article, the expression "outer side" means a side away from the center of the display region, in other words, a side close to the non-display region. For example, "outer side of the sub-pixels" means a side of the sub-pixels close to the non-display region.

Figure 4:
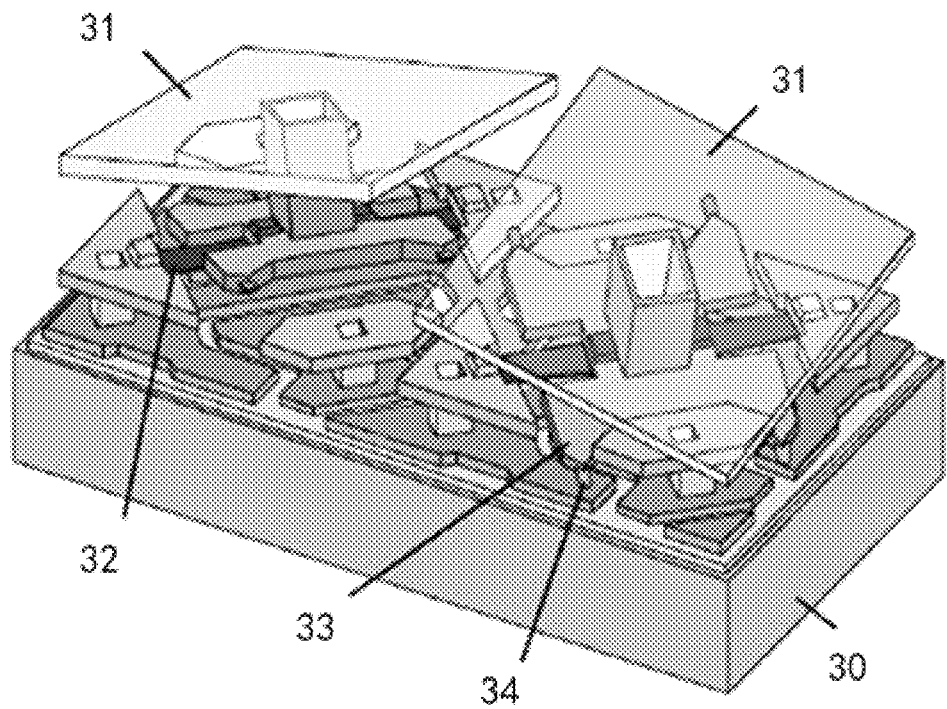
FIG. 4 is a schematic structure diagram of a first digital micro-mirror device according to the embodiments of the present disclosure.
Figure 5:
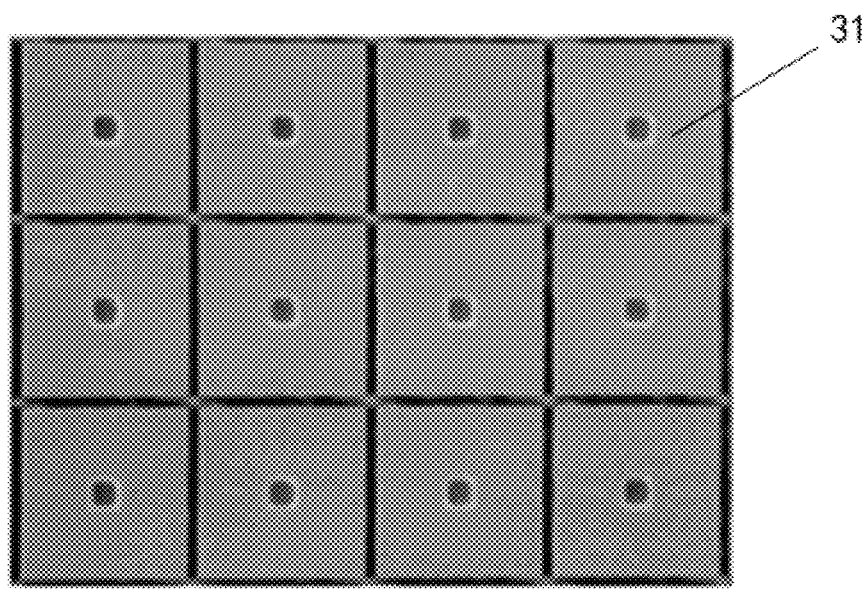
FIG. 5 is a schematic structure diagram of a second digital micro-mirror device according to the embodiments of the present disclosure.

The scanning pitch described above may be realized by adjusting a digital micro-mirror device (DMD). With reference to FIG. 4 and FIG. 5, DMD of the digital exposure machine comprises a plurality of mirrors 31 arranged in an array. In FIG. 4, two micro-mirrors 31 are disposed on CMOS (complementary metal oxide semiconductor) substrate. Fixation and rotation of the micro-mirrors 31 may be realized by hinge 32, yoke 33, spring tip 34, etc.

Figure 6:
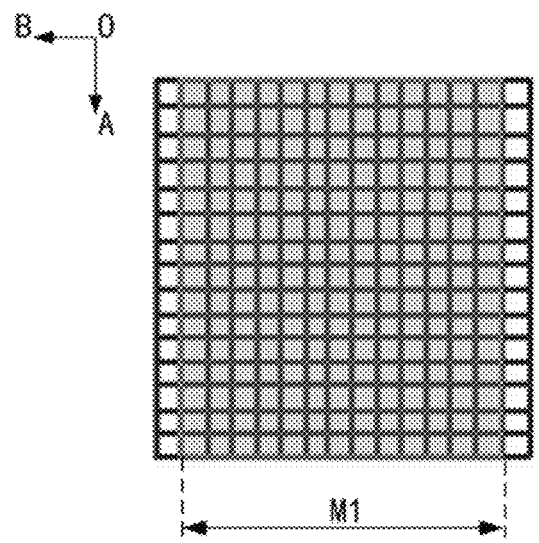
FIG. 6 is a schematic structure diagram of a third digital micro-mirror device according to the embodiment of the present disclosure.
Figure 7:
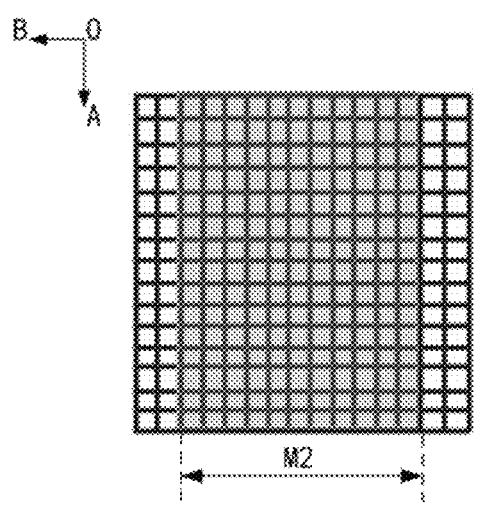
FIG. 7 is a flow chart of a fourth image expression method according to the embodiments of the present disclosure.
Figure 8:
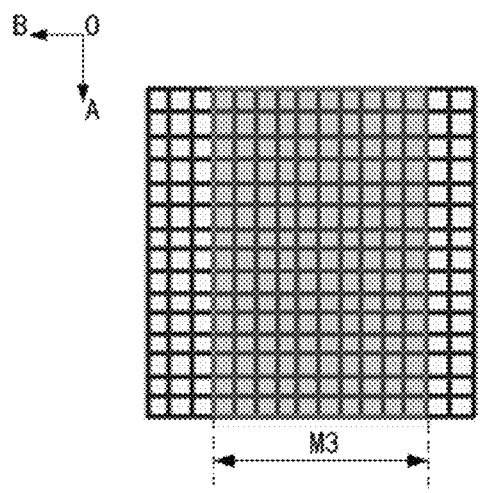
FIG. 8 is a flow chart of a fifth image expression method according to the embodiments of the present disclosure.

For example, a commonly used DMD comprises 2560*1600 micro-mirrors, and the size of each micro-mirror is 1.26 µm*1.26 µm. If the entire DMD is activated, the size of the DMD is 3225.6 µm*2016 µm. By adjusting the number of DMDs which are activated, the scanning pitch may be changed. With reference to FIGS. 6-8, the direction OA may represent the stepping direction, and the direction OB may represent the scanning direction. In the scanning direction OB, each column comprises 1600 micro-mirrors; in the stepping direction OA, each row comprises 2560 micro-mirrors. As shown in FIG. 6, if the pitch of two adjacent rows of sub-pixels in the scanning direction OB is P1, M1 columns are activated correspondingly, wherein M1*1.26 is divisible by P1; as shown in FIG. 7, if the pitch of two adjacent rows of sub-pixels in the scanning direction OB is P2, M2 columns are activated correspondingly, wherein M2*1.26 is divisible by P2; as shown in FIG. 8, if the pitch of two adjacent rows of sub-pixels in the scanning direction OB is P3, M3 columns are activated correspondingly, wherein M3*1.26 is divisible by P3. FIGS. 6-8 only schematically illustrate the DMD, and do not show all the micro-mirrors comprised in the DMD.

The embodiments of the present disclosure provide an exposure control method of a digital exposure machine applied to a display mother board to be exposed, the display mother board to be exposed comprises at least a first display substrate to be exposed, and the first display substrate to be exposed comprises a plurality of sub-pixels arranged in an array. The exposure control method comprises: performing a plurality of scannings with a start at an outer side of a first row of the sub-pixels in a scanning direction of the digital exposure machine, to expose a display region of the first display substrate to be exposed, wherein a scanning pitch used in each scanning is integer times of a pitch of two adjacent rows of sub-pixels of the first display substrate to be exposed in the scanning direction.

With reference to FIG. 2, the overlapped region 1 between two adjacent scannings may fall within the region between two adjacent rows of sub-pixels of the first display substrate to be exposed, and there are not patterns in the region between two adjacent rows of sub-pixels, so that the region between two adjacent rows of sub-pixels is an ineffective pattern region. In this way, it is possible to avoid the misalignment and the positional splicing difference of the exposed pixel patterns which may otherwise be caused due to the overlapped region 11 of two adjacent scannings falling within the region 12 in which the pixel patterns are located as shown in FIG. 3, thereby reducing the difference in the critical dimension of TFT significantly. In this way, the periodic MURA phenomenon is reduced, the display effect is improved, and the quality of the display panel is also improved.

Mura is a relatively common phenomenon in the TFT-LCD producing process, and the resulting defects have a great influence on the image quality. Mura mainly refers to a phenomenon of uneven brightness. Mura may be divided into three types from the reasons: the first type is electrical and optical MURA caused by the difference in the critical dimension parameters of thin film transistors during the array forming process; the second type is the difference caused by the alignment film or the liquid crystal itself during the filling of the liquid crystal; the third type is the difference caused by the light source itself.

Figure 9:
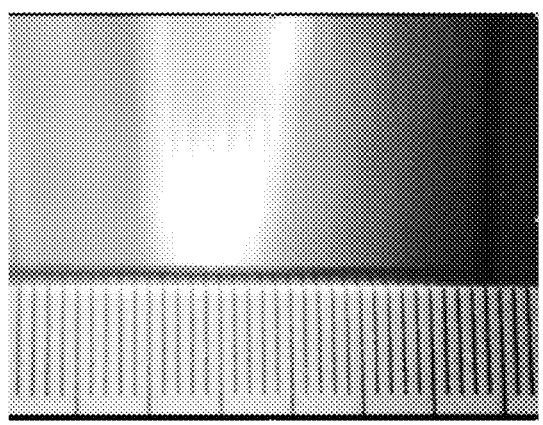
FIG. 9 is a testing effect diagram before modification according to the embodiments of the present disclosure.
Figure 10:
FIG. 10 is a testing effect diagram after modification according to the embodiments of the present disclosure.

For example, the embodiments of the present disclosure may at least partially alleviate or eliminate the aforementioned first type of MURA, however, the embodiments of the present disclosure are not limited to this. FIG. 9 is a MURA diagram before modification, and FIG. 10 is a MURA diagram after adopting the exposure control method of the embodiments of the present disclosure, compared with the former, MURA phenomenon has been reduced significantly. FIGS. 9 and 10 are both testing effect diagrams in the semi-finished product stage, and in the final test forming the display panel in the later stage, MURA of the display panel corresponding to FIG. 10 is completely in the qualified range.

Figure 11:
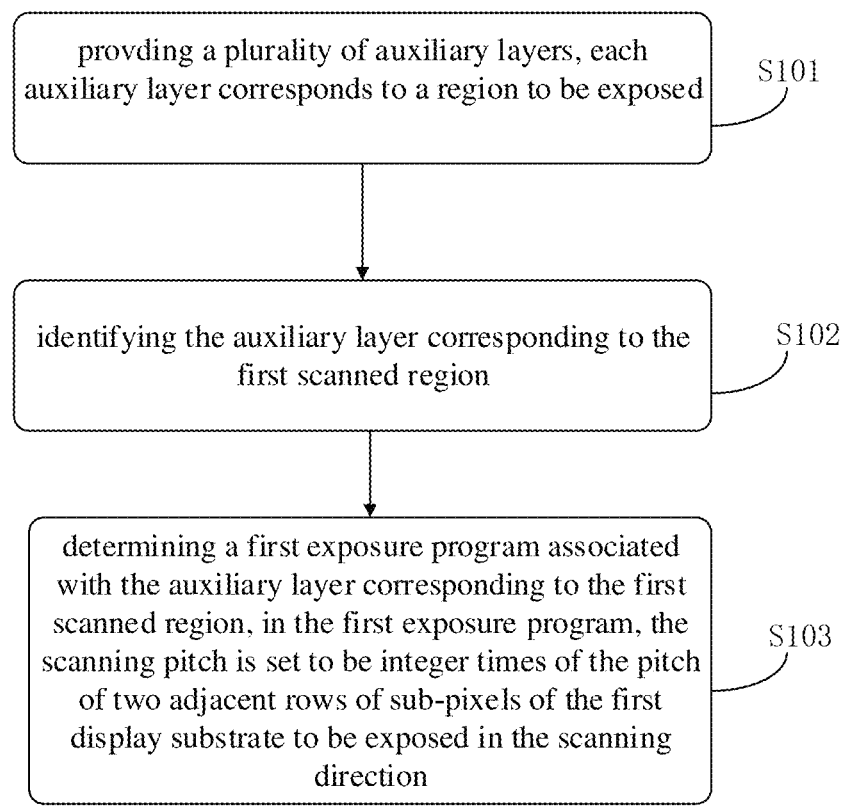
FIG. 11 is a schematic flow chart of another exposure control method of the digital exposure machine according to the embodiments of the present disclosure.

Optionally, the plurality of scannings described above comprise a first scanning, and a first scanned region is a region which is scanned in the first scanning; before the first scanning, with reference to FIG. 11, the exposure control method may further comprise following steps.

In step S101, a plurality of auxiliary layers are provided, each auxiliary layer corresponding to a region to be exposed.

In the embodiments of the present disclosure, the number and scale of the auxiliary layer are not limited, which may be determined according to the display substrate to be exposed. The auxiliary layers may be set by means of a software of the digital exposure machine. The region to be exposed may be a part of the display region of the display substrate to be exposed, that is the display substrate to be exposed may correspond to a plurality of auxiliary layers. The plurality of auxiliary layers corresponds to a plurality of exposure programs respectively. If a display substrate to be exposed corresponds to a plurality of auxiliary layers, scanning pitches set in the exposure programs associated with various auxiliary layers may be the same, or may be different. For example, scanning pitches set in the exposure programs associated with various auxiliary layers may be the same to reduce the complexity of the exposure control method. The region to be exposed may further be an entire display region of a display substrate to be exposed, that is the display substrate to be exposed only corresponds to one auxiliary layer. The region to be exposed may further be an entire region comprising a plurality of display substrates to be exposed, that is the plurality of display substrates only correspond to one auxiliary layer.

In step S102, the auxiliary layer corresponding to the first scanned region is identified.

In the embodiments of the present disclosure, the specific identification manner is not limited, for example, identification may be performed via coordinate parameters.

In step S103, a first exposure program associated with the auxiliary layer corresponding to the first scanned region is determined. In the first exposure program, the scanning pitch is set to be integer times of the pitch of two adjacent rows of sub-pixels of the first display substrate to be exposed in the scanning direction.

For example, in the first exposure program, the exposure parameters may be set. For example, the scanning pitch, the exposure time may be set.

In the embodiments of the present disclosure, the specific associating manner of the auxiliary layer and the first exposure program is not limited. For example, the coordinate region of the auxiliary layer may be associated with the first exposure program.

By providing the auxiliary layer, different exposure programs associating with different scanned regions may be realized. Thereby, requirements of various regions on the exposure parameters may be realized.

Figure 12:
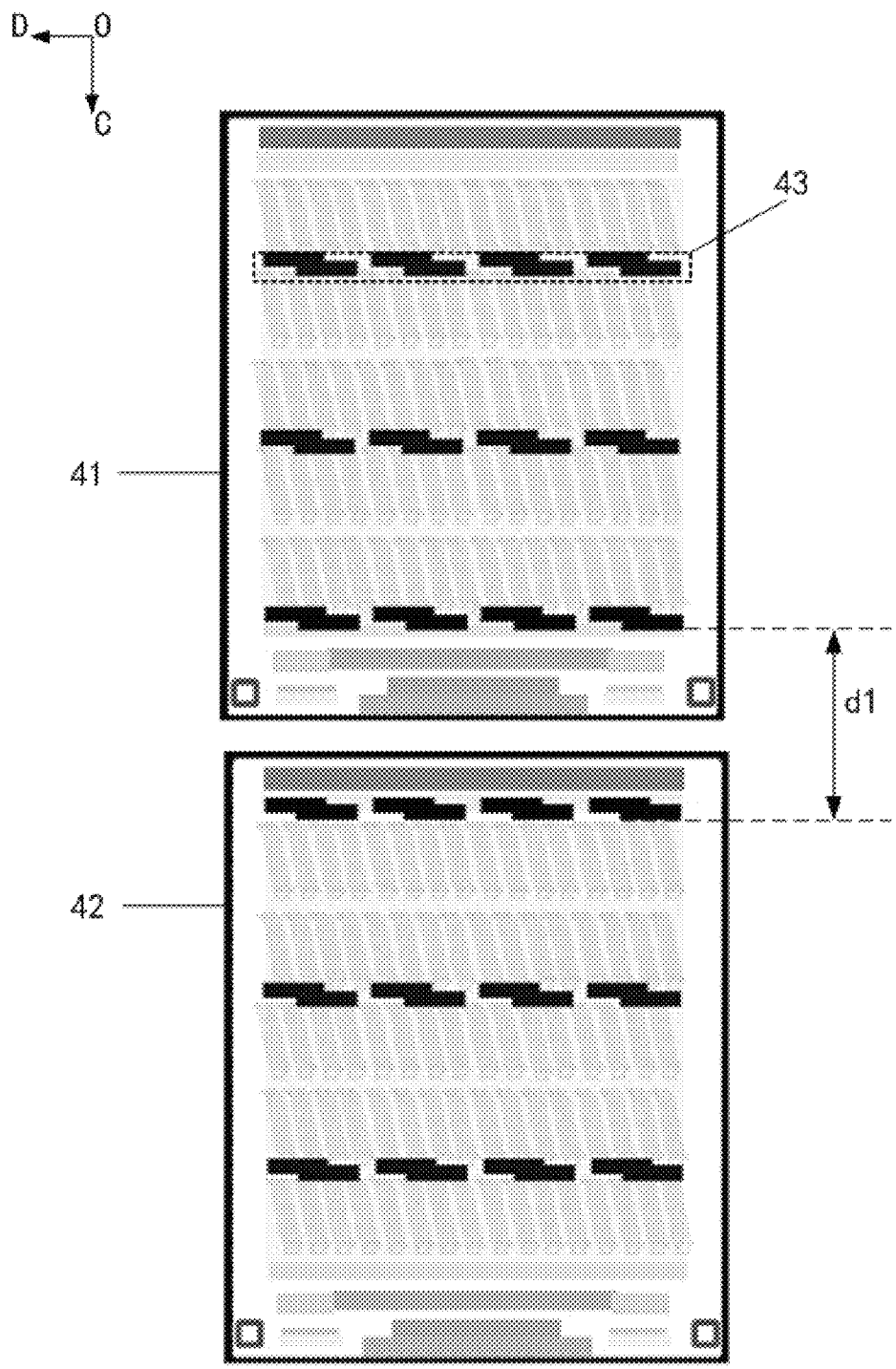
FIG. 12 is a schematic structural view of a display mother board to be exposed according to the embodiments of the present disclosure.
Figure 13:
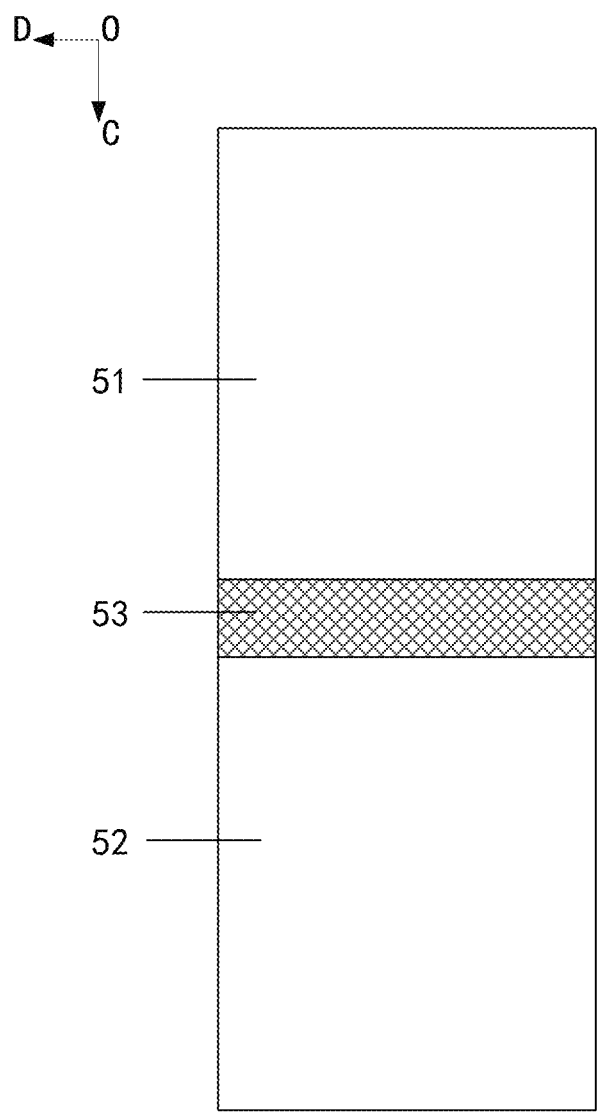
FIG. 13 is a schematic view of an auxiliary layer corresponding to FIG. 12 according to the embodiments of the present disclosure.

Optionally, with reference to FIG. 12, the display mother board to be exposed further comprises a second display substrate to be exposed 42. The second display substrate 42 is adjacent to the first display substrate to be exposed 41 in the scanning direction OC. With reference to FIG. 13, two adjacent auxiliary layers (that is, the auxiliary layer 51 and the auxiliary layer 52) have an overlapped region 53, and the overlapped region 53 corresponds to the region between display regions of the first display substrate to be exposed and the second display substrate to be exposed.

The second display substrate to be exposed and the first display substrate to be exposed described above may have the same specifications (that is the same size, shape, etc.), or different specifications. FIG. 12 is specified in which the second display substrate to be exposed and the first display substrate have the same specifications.

An exposure program is associated with the overlapped region 53 described above, in the exposure program, a distance between display regions of the first display substrate to be exposed and the second display substrate to be exposed (for example, d1 in FIG. 12) is set to be integer times of the scanning pitch. FIG. 12 is shown in which the distance d1 between display regions of the first display substrate 41 to be exposed and the second display substrate 42 to be exposed is one time of the scanning pitch. For example, the coordinate region of the overlapped region may be associated with the exposure program.

By providing the overlapped region, a transition of the exposure from the display region of the first display substrate to be exposed to the display region of the second display substrate to be exposed may be realized, thereby facilitating the switch of exposure programs.

Further optionally, the plurality of scannings further comprise a second scanning, and the second scanned region is a region which is scanned in the second scanning.

Figure 15:
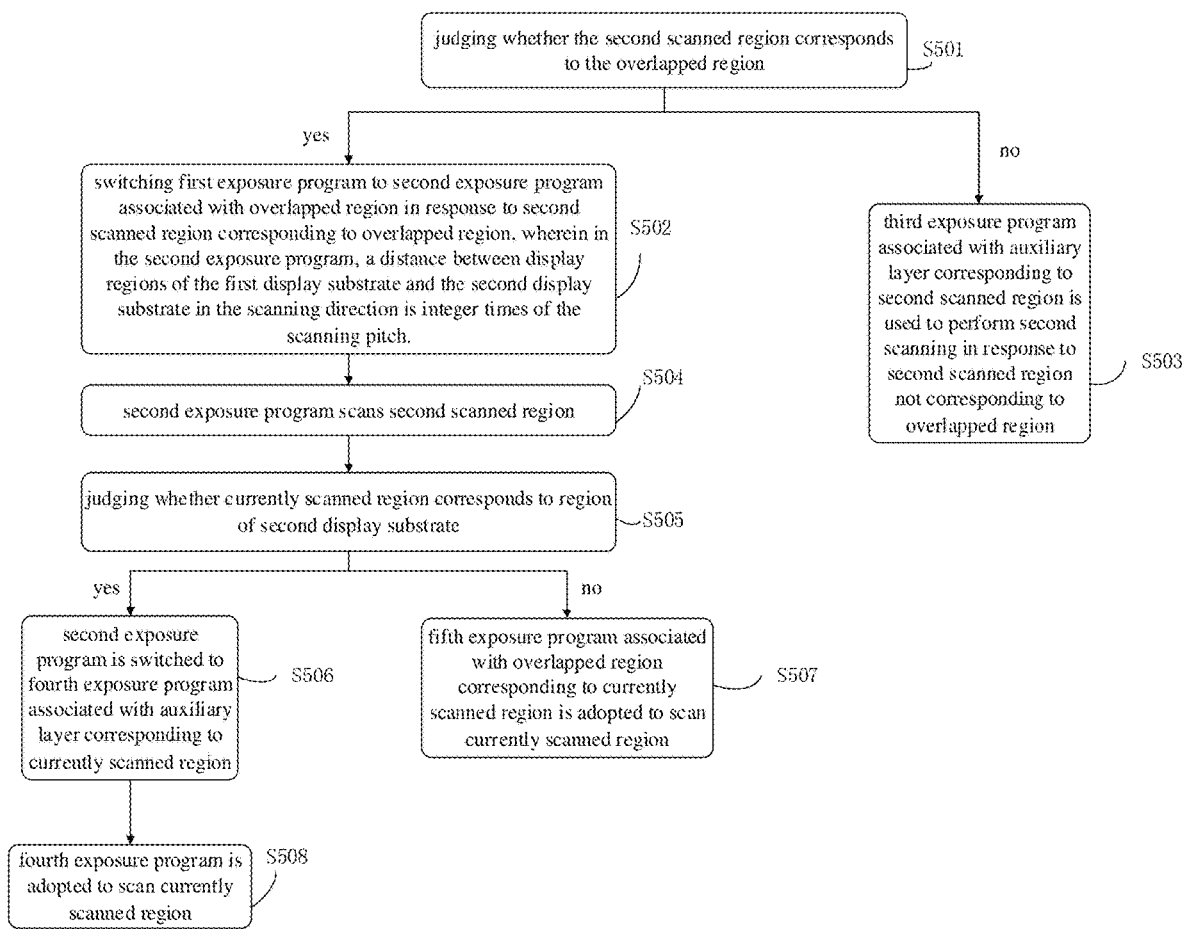
FIG. 15 is a flow chart of a further exposure control method of the digital exposure machine according to the embodiments of the present disclosure.

After the first scanning, with reference to FIG. 15, the exposure control method may further comprise following steps.

In step S501, whether the second scanned region corresponds to the overlapped region is judged.

In step S502, if the second scanned region corresponds to the overlapped region, the first exposure program is switched into the second exposure program associated with the overlapped region corresponding to the second scanned region. In the second exposure program, a distance between display regions of the first display substrate to be exposed and the second display substrate to be exposed in the scanning direction is set to be integer times of the scanning pitch.

In this case, the exposure of the display region of the first display substrate to be exposed is completed. In the second exposure program associated with the overlapped region corresponding to the second scanned region, the distance between display regions of the first display substrate to be exposed and the second display substrate to be exposed in the scanning direction is set to be integer times of the scanning pitch. In this way, after the region between display regions of the first display substrate to be exposed and the second display substrate to be exposed corresponding to the overlapped region is exposed, the starting scanned position of the second display substrate to be exposed falls within the region corresponding to the overlapped region, that is the outer side of the display region of the second display substrate to be exposed.

In step S503, if the second scanned region does not correspond to the overlapped region, a third exposure program associated with the auxiliary layer corresponding to the second scanned region is adopted to perform the second scanning. In the third exposure program, the scanning pitch is set to be integer times of the pitch of two adjacent rows of sub-pixels of the first display substrate to be exposed in the scanning direction.

In this case, the exposure of the first display substrate to be exposed has not been completed. The third exposure program and the first exposure program may be the same exposure program, or may be different exposure programs. In order to simplify the exposure control method and acquire a more uniform pattern, the third exposure program and the first exposure program are selected to be the same exposure program. Meanwhile, the scanning pitch of the third exposure program and the scanning pitch of the first exposure program are set to be the same.

In step S503, after using the third exposure program associated with the auxiliary layer corresponding to the second scanned region to perform the second scanning, repeat steps S501, S503 until the exposure of the display region of the first display substrate to be exposed is completed.

Optionally, after step S502, with reference to FIG. 15, the exposure control method described above may further comprise a step S504. In the step S504, the second exposure program is adopted to scan the second scanned region.

Optionally, after the step S504, with reference to FIG. 15, the exposure control method may further comprise steps S505 and S506.

In the step S505, whether the currently scanned region corresponds to the region to be exposed of the second display substrate to be exposed is judged. For example, the auxiliary layer corresponding to the region to be exposed of the second display substrate to be exposed may be determined, and then whether the currently scanned region corresponds to the auxiliary layer is judged.

In the step S506, if the currently scanned region corresponds to the region to be exposed of the second display substrate to be exposed, the second exposure program is switched into a fourth exposure program associated with the auxiliary layer corresponding to the currently scanned region. In the fourth exposure program, the scanning pitch is set to be integer times of the pitch of two adjacent rows of sub-pixels of the second display substrate to be exposed in the scanning direction.

In this case, the exposure of the region between display regions of the first display substrate to be exposed and the second display substrate to be exposed has been completed, and it is possible to start scanning the second display substrate to be exposed.

If the first display substrate to be exposed and the second display substrate to be exposed belong to display substrates of same specifications, the fourth exposure program and the first exposure program are selected to be the same exposure program for simplifying the exposure control method and reducing the difference in same type of products. Meanwhile, the scanning pitch of the fourth exposure program and the scanning pitch of the first exposure program are the same.

In the embodiments of the present disclosure, in the fourth exposure program, the scanning pitch is set to be integer times of the pitch of two adjacent rows of sub-pixels of the second display substrate to be exposed in the scanning direction, so that it may be avoided that the overlapped region of the current scanning and the next scanning is located in the pixel pattern region.

Optionally, the exposure control method may further comprise a step S507. In the step S507, if the currently scanned region does not correspond to the region to be exposed of the second display substrate to be exposed, a fifth exposure program associated with the overlapped region corresponding to the currently scanned region is adopted to scan the currently scanned region. In the fifth exposure program, the distance between display regions of the first display substrate to be exposed and the second display substrate to be exposed in the scanning direction is set to be integer times of the scanning pitch.

In this case, the exposure of the region between display regions of the first display substrate to be exposed and the second display substrate to be exposed has not been completed. The fifth exposure program and the second exposure program may be the same exposure program, or may be different exposure programs. The fifth exposure program and the second exposure program are selected to be the same exposure program for simplifying the exposure control method. Meanwhile, the scanning pitch of the fifth exposure program and the scanning pitch of the second exposure program are the same.

After the step S507, steps S505, S507 are repeated until the exposure of the region between display regions of the first display substrate to be exposed and the second display substrate to be exposed is completed.

Optionally, after the step S506, with reference to FIG. 15, the exposure control method further comprises a step S508. In the step S508, the fourth exposure program is adopted to scan the currently scanned region.

In the fourth exposure program, the scanning pitch is set to be integer times of the pitch of two adjacent rows of sub-pixels of the second display substrate to be exposed, the fourth exposure program is adopted to scan the currently scanned region, and it may be avoided that the overlapped region of the current scanning and the next scanning is located in the pixel pattern region. Thereby it is beneficial to solve the problem that the overlapped region of two adjacent scannings falls within the pixel pattern region, so that the misalignment and the positional splicing difference of the exposed pixel pattern in the second display substrate to be exposed may be avoided.

After the step S508, the step S508 is repeated until the exposure of the display region of the second display substrate to be exposed is completed. In this way, the misalignment and the positional splicing difference of the exposed pixel pattern in the second display substrate to be exposed may be avoided.

Figure 14:
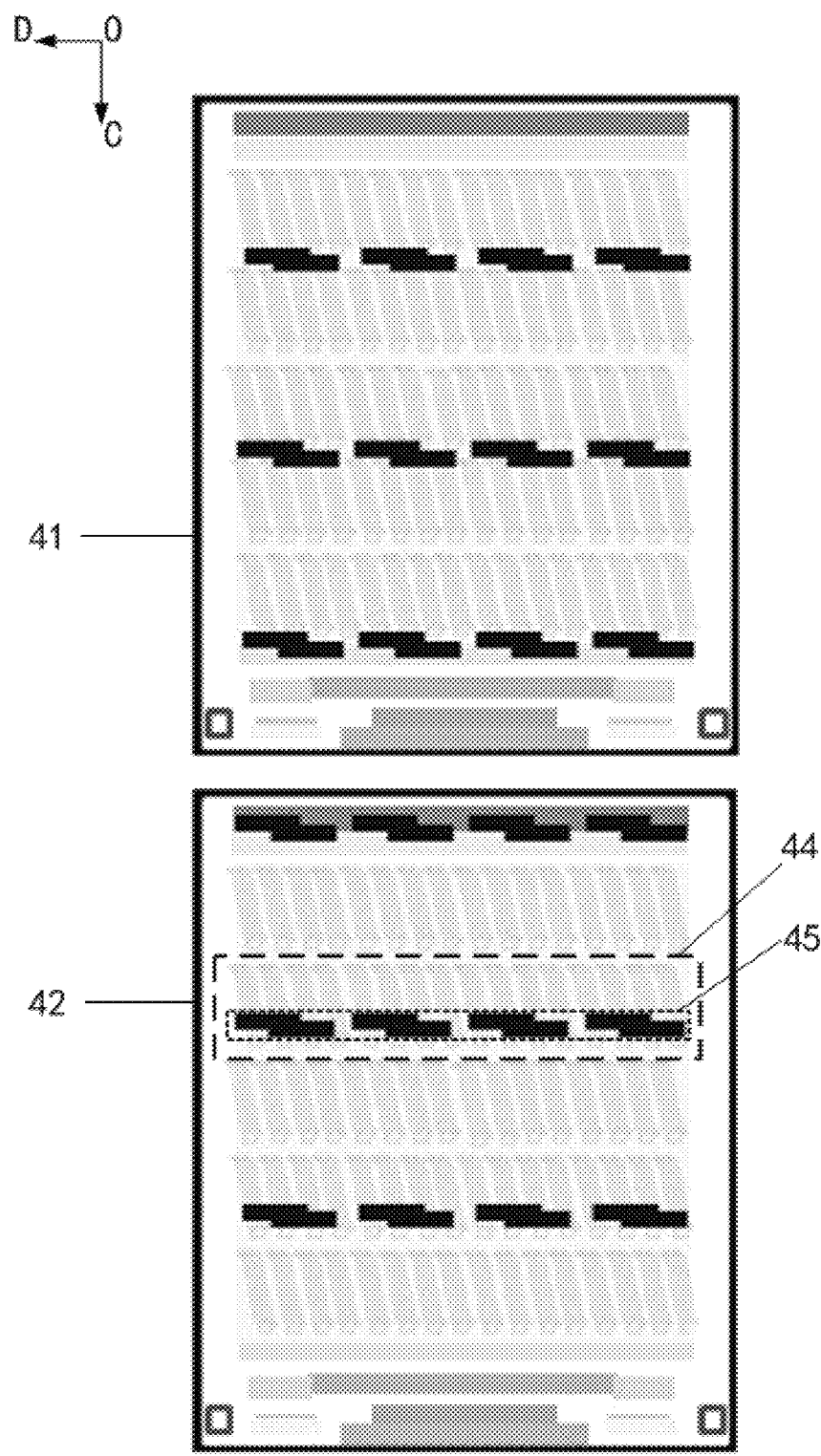
FIG. 14 is a schematic structural view of another display mother board to be exposed according to the embodiments of the present disclosure.

It should be noted that, in the related art, in the exposure of single display substrate to be exposed, the misalignment and the positional splicing difference of the exposed pixel pattern due to the overlapped region of two adjacent scannings falling within the pixel pattern region is present; in addition, in exposing two adjacent display substrates to be exposed, with reference to FIG. 14, the problem of the overlapped region of two adjacent scannings falling within the pixel pattern region does not occur in exposing the first display substrate 41 to be exposed, however, in exposing the second display substrate 42 to be exposed, the problem of the overlapped region 45 of two scannings falling within the pixel pattern region 44 is still present. The problem may be solved using the exposure control method described above. After adopting the exposure control method described above, with reference to FIG. 12, the problem of the overlapped region of two adjacent scannings falling within the pixel pattern region does not occur in both the first display substrate to be exposed 41 and the second display substrate to be exposed 42, thereby reducing the difference in the critical dimension of TFT of the first display substrate to be exposed and the second display substrate to be exposed, which in turn reduces the periodic MURA phenomenon, thereby improving the display effect.

Figure 16:
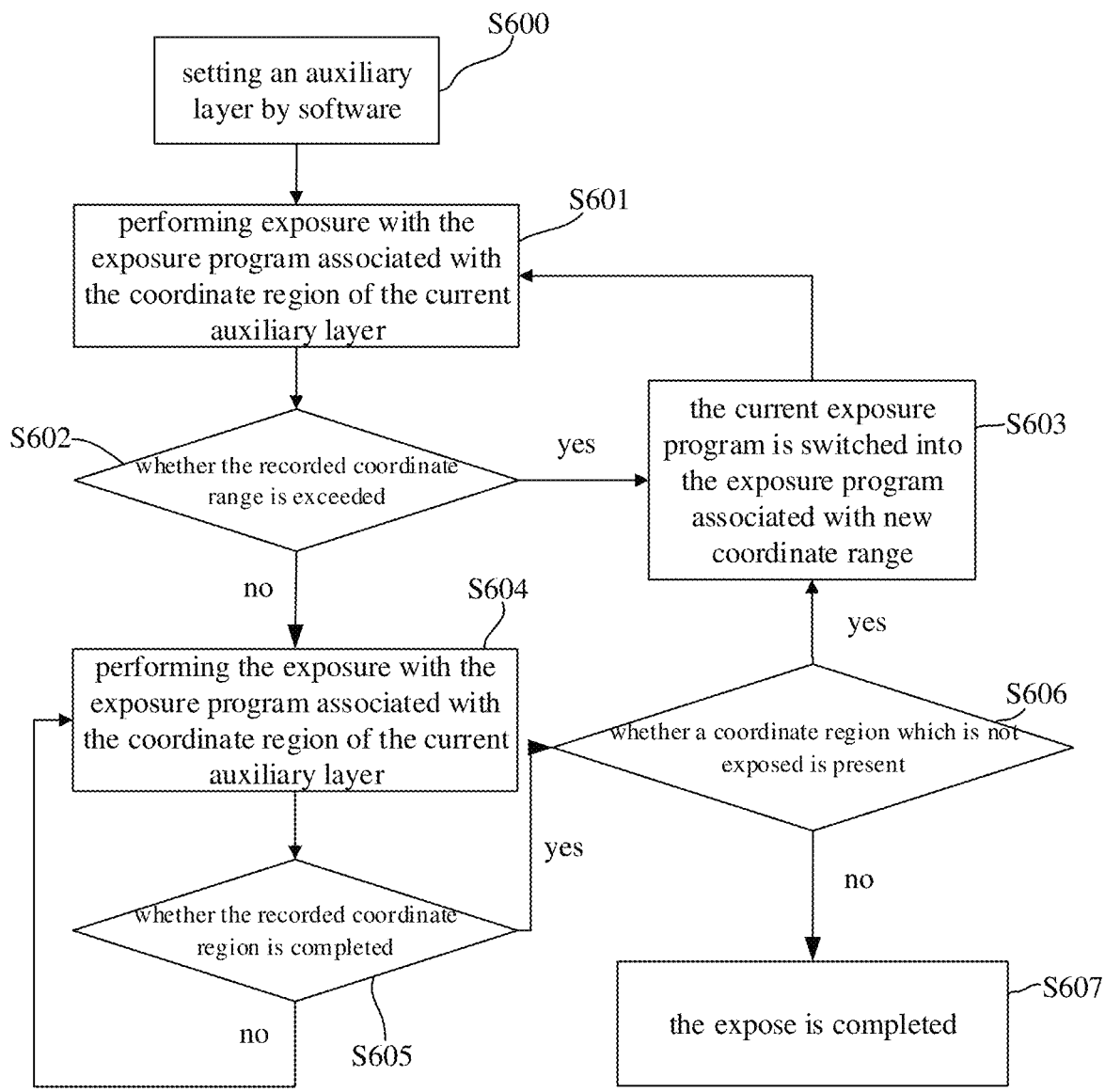
FIG. 16 is a flow chart of another further exposure control method of the digital exposure machine according to the embodiments of the present disclosure.

The embodiments of the present disclosure provide an exposure control method, with reference to FIG. 16, the exposure control method may comprise following steps:

In step S600, an auxiliary layer is set by means of software.

Figure 17:
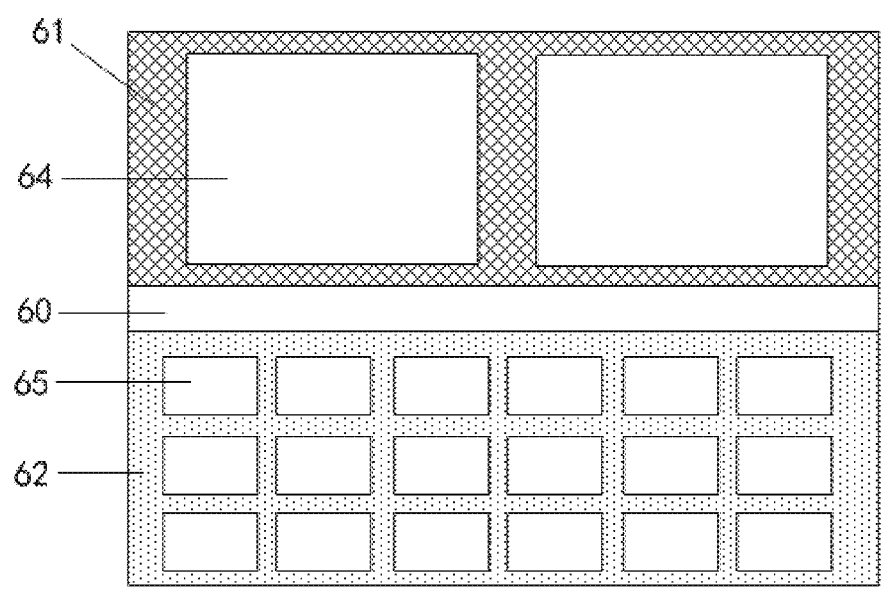
FIG. 17 is a schematic view of another auxiliary layer according to the embodiments of the present disclosure.

The auxiliary layer may define an exposure region of a corresponding laser head, and a certain range of overlapped region is provided between the auxiliary layers in the scanning direction, and the overlapped region corresponds to the ineffective pattern region. Referring to FIG. 17, FIG. 17 shows the overlapping area 60 of the auxiliary layer 61, the auxiliary layer 62, the auxiliary layer 61 and the auxiliary layer 62. The area to be exposed corresponding to the auxiliary layer 61 includes two display substrates 64 to be exposed, which have the same size. The area to be exposed corresponding to the auxiliary layer 62 includes eighteen display substrates 65 to be exposed, which have the same size.

Figure 19:
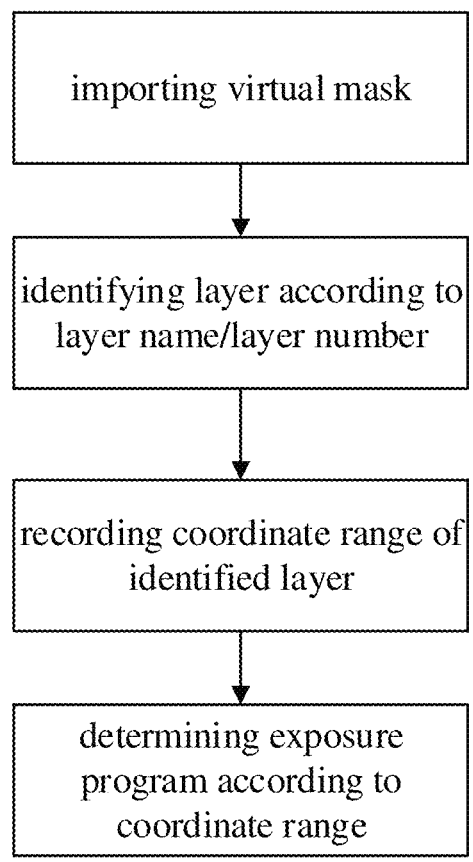
FIG. 19 is a schematic flow chart of a setting method of an auxiliary layer according to the embodiments of the present disclosure.
Figure 20:
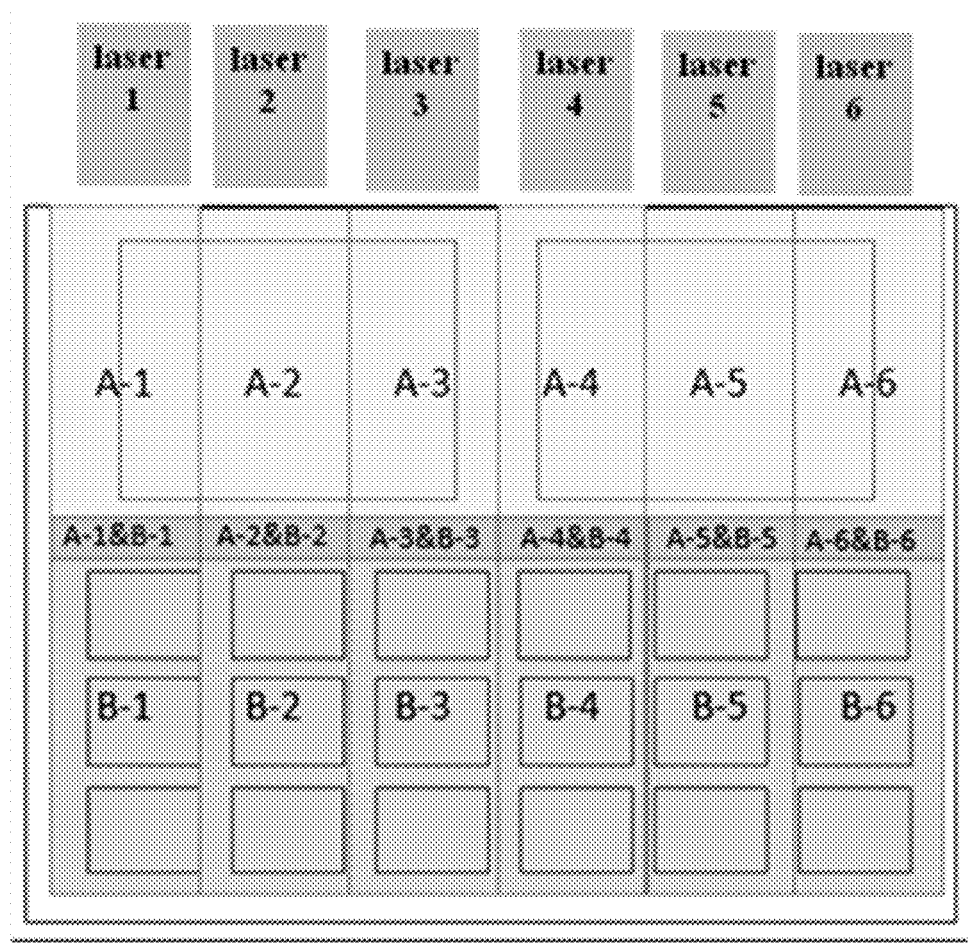
FIG. 20 is a schematic view of another auxiliary layer according to the present disclosure.

The aforementioned auxiliary layer is a type of layer that limits the exposure parameters and the exposure regions added in the layout during the virtual mask design. Under normal circumstances, each laser head is provided with an auxiliary layer which passes through the effective exposure region, and the digital exposure machine needs to identify and read the layer during exposure. With reference to FIG. 19, after the virtual mask file is imported into the digital exposure machine, it may identify the layer according to features such as "layer name" and "layer number", and record the coordinates of the layer region, and then determine the exposure program according to the coordinate range. With reference to FIG. 20, each laser head is provided with more than one auxiliary layer, at least auxiliary layers A and B are provided. The auxiliary layers under different laser head numbers may be set to A-1, B-1, A-2, B-2, etc. in sequence and so on. The auxiliary layers in the scanning direction of the same laser head have a certain range of overlapped region A&B. The overlapped region A&B is provided in the non-effective pattern region and the width thereof is adjustable.

In the step S601, the auxiliary layer is identified, so that the exposure program associated with the coordinate region of the current auxiliary layer is used to perform the exposure.

Figure 18:
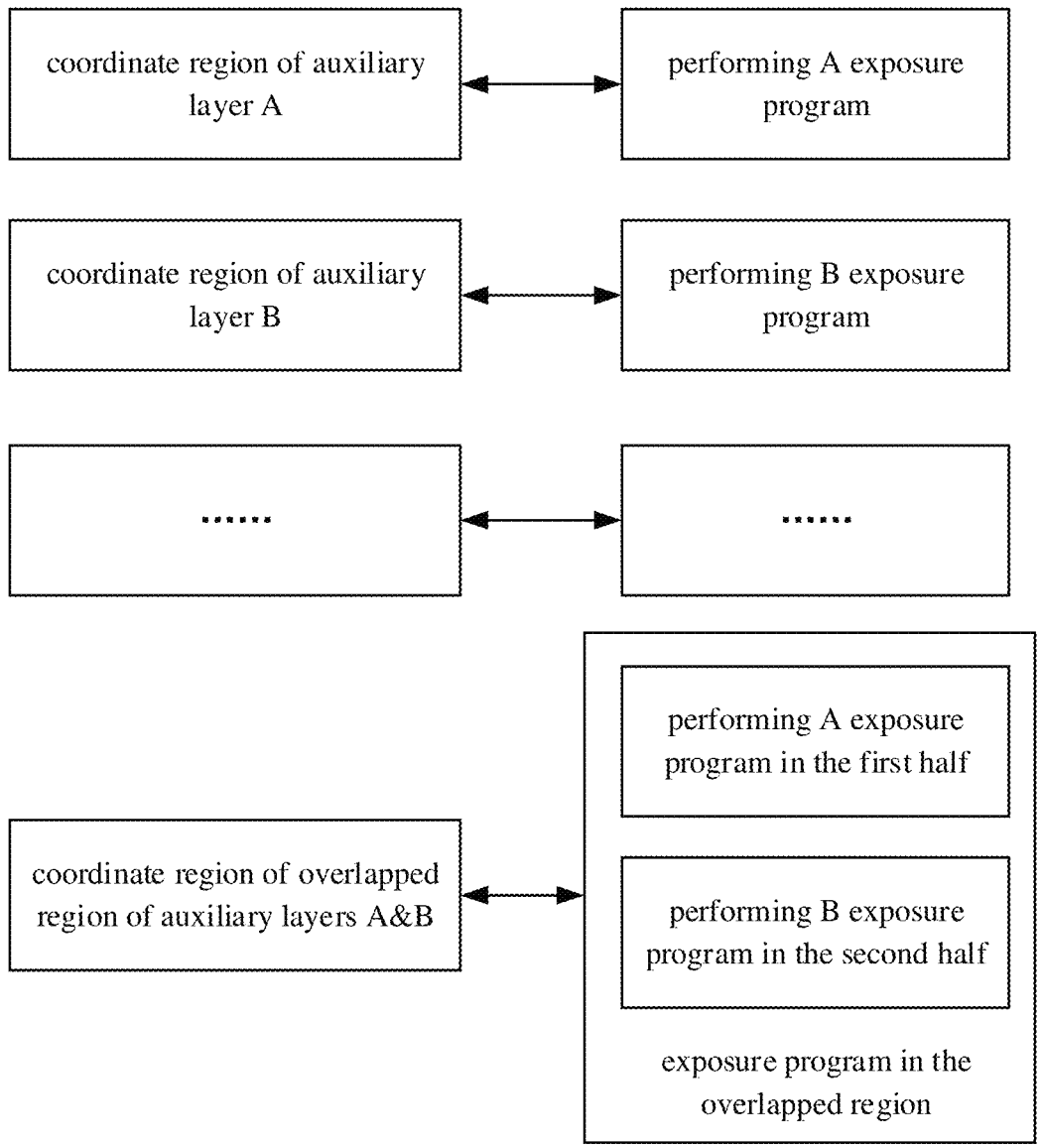
FIG. 18 is a schematic association view of an auxiliary layer and an exposure program according to the embodiments of the present disclosure.

With reference to FIG. 18, the coordinate region of the auxiliary layer A is associated with A exposure program, the coordinate region of the auxiliary layer B is associate with B exposure program, the coordinate region of the overlapped region of the auxiliary layer A and the auxiliary layer B is associated with the overlapped region exposure program. In the overlapped region exposure program, the A exposure program is performed in the first half and the B exposure program is performed in the second half, which ensures that there is enough time for the A exposure program and the B exposure program to switch during the movement of a glass substrate, and the switch of the exposure program does not affect the effect of panels with two sizes. Taking the auxiliary layers shown in FIG. 17 as an example, when a laser head control system identities the exposure auxiliary layer 61, performs the corresponding exposure program, so that the exposure effect of a large-scale may be ensured; when the exposure auxiliary layer 62 is identified, the corresponding exposure program is performed and the exposure effect of a small-scale may be ensure; when the overlapped region 60 of the auxiliary layers 61 and 62 is identified, prepare for the switch of the exposure program is performed, the exposure program corresponding to the auxiliary layer 61 is performed in the first half and the exposure program corresponding to the auxiliary layer 62 is performed in the second half.

In the step S602, whether the recorded coordinate range is exceeded is judged, in this way, whether other auxiliary layers are identified may be judged.

In the step S603, if the recorded coordinate range is exceeded, the current exposure program is switched into the exposure program associated with the new coordinate range.

In the step S604, if the recorded coordinate range is not exceeded, the exposure program associated with the coordinate region of the current auxiliary layer is used to perform exposure continuously.

After the step S604, the exposure control method further comprises:
  S605: judging whether the recorded coordinate region is completed;
  S606: if the recorded coordinate region is completed, judging whether a coordinate region which is not exposed is present; and
  S607: if there is not a coordinate region which is not exposed, the expose is completed, and the glass substrate of the digital exposure machine returns back to the initial position.

Optionally, in the step S607, if there is a coordinate region which is not exposed, the step S603 is performed to expose the coordinate region which is not exposed.

It should be noted that, in panel design, panels of the same size and the same pattern density are usually arranged on an entire glass substrate. When different sizes of panels are designed on the glass substrate, the difference in the sizes and pattern densities leads to the change of the optical effect of the exposure. The same exposure program using the same mask to expose in a shot manner may not guarantee that panels of each size achieve the expected exposure effect. Therefore, when a current exposure machine uses a mask to expose panels of different sizes on the same glass substrate, the panel exposure effect of only one size may be guaranteed at the expense of other sizes, or design patterns of other sizes will be compensated through exposure experiments, which is time-consuming and labor-intensive.

In the embodiments of the present disclosure, when the display mother board to be exposed comprises a plurality of display substrates to be exposed which have different sizes, by providing a plurality of auxiliary layers to correspond to the display substrates to be exposed which have different sizes, thereby the display substrates to be exposed which have different sizes are associated with different exposure programs. In this way, after the subsequent exposure is completed, exposure patterns of different sizes may be obtained. That is to say, it can be realized that when using a mask to expose panels of different sizes on the same glass substrate, different exposure programs may be used to guarantee the exposure effect of different sizes of patterns.

The embodiments of the present disclosure further provide a digital exposure applied to a display mother board to be exposed, the display mother board to be exposed comprises at least a first display substrate to be exposed, and the first display substrate to be exposed comprises a plurality of sub-pixels arranged in an array. The digital exposure machine comprises: a scanning module, configured to perform a plurality of scannings with a start at an outer side of a first row of sub-pixels in a scanning direction of the digital exposure machine, to expose a display region of the first display substrate to be exposed, wherein a scanning pitch used in each scanning is integer times of a pitch of two adjacent rows of sub-pixels of the first display substrate to be exposed in the scanning direction.

The display substrate exposed by the digital exposure machine may avoid the misalignment and the positional splicing difference of the pixel pattern after exposure due to the overlapped region of two adjacent scannings falling with the pixel pattern region, thereby reducing the difference in the critical dimension of TFT significantly. In this way, the periodic MURA phenomenon is reduced, the display effect is improved, and the quality of the display panel is also improved.

Figure 21:
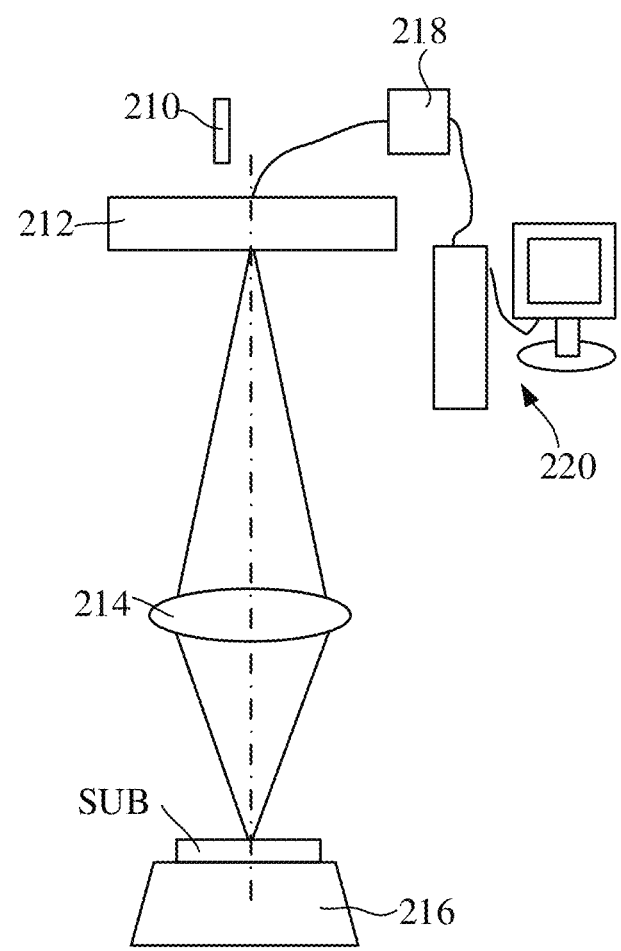
FIG. 21 is a schematic structural view of the digital exposure machine according to some exemplary embodiments of the present disclosure.

FIG. 21 is a schematic structural view of the digital exposure machine according to some exemplary embodiments of the present disclosure. With reference to FIG. 1-FIG. 21, the digital exposure machine may comprise a light source 210, a digital micro-mirror device 212, a projection objective 214, a work stage 216, a digital micro-mirror array controller 218 and a computer 220. The display mother board SUB to be exposed may be disposed on the work stage 216.

The light source 210 may comprise a laser head for emitting light of a specific wavelength, for example, ultraviolet light, deep ultraviolet light, or even shorter wavelength extreme ultraviolet light may be used according to actual needs.

The computer 220 generates various gray-scale digital images, and transmits the required graphics and images to the digital micro-mirror device 212 through the digital micro-mirror array controller 218 to form the required digital mask pattern. The digital mask may spatially modulate the illuminating light on the digital micro-mirror device 212 to form any desired gray-scale pattern, and the projection objective 214 will image and copy the pattern onto the photoresist-coated display mother board SUB to be exposed, so as to form a predetermined pattern.

For example, the digital micro-mirror device 212 may refer to the descriptions to FIGS. 4 and 5.

In the embodiments of the present disclosure, the scanning module may comprise the light source 210 and the digital micro-mirror device 212 for projecting light of a predetermined pattern onto the display mother board SUB to be exposed.

Figure 22:
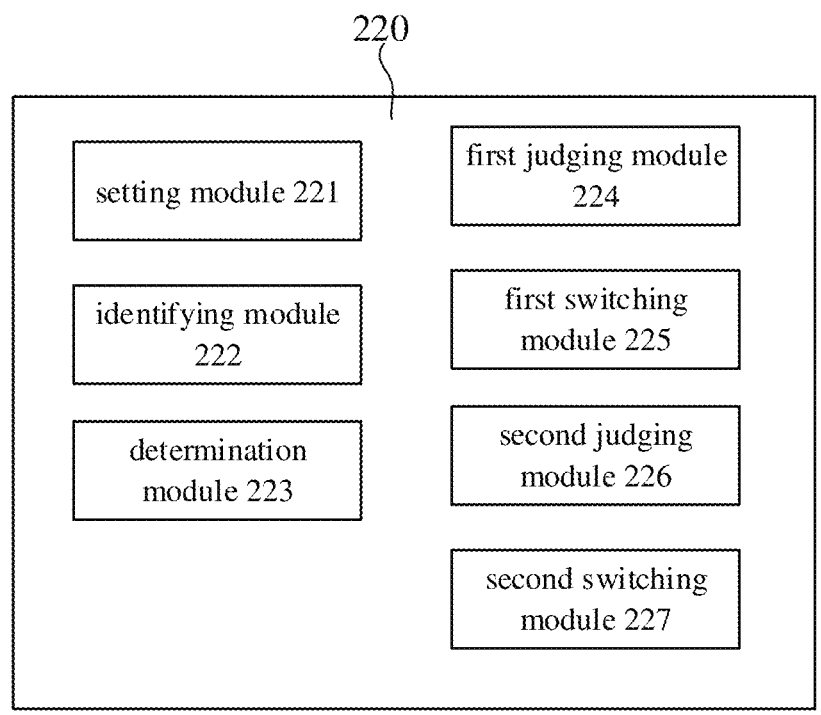
FIG. 22 is a hardware block diagram of the digital exposure machine according to some exemplary embodiments of the present disclosure.

FIG. 22 is a hardware block diagram of the digital exposure machine according to some exemplary embodiments of the present disclosure.

According to some exemplary embodiments, the plurality of scannings comprise a first scanning, and a first scanned region is a region which is scanned in the first scanning. With reference to FIGS. 21 and 22, the digital exposure machine further comprises: a setting module 221, configured to provide a plurality of auxiliary layers, the plurality of auxiliary layers corresponding to a plurality of scanned regions respectively, the plurality of auxiliary layers associating with a plurality of exposure programs respectively; an identifying module 222, configured to identify the auxiliary layer corresponding to the first scanned region; and a determination module 223, configured to determine a first exposure program associated with the auxiliary layer corresponding to the first scanned region, wherein in the first exposure program, the scanning pitch is set to be integer times of the pitch of two adjacent rows of sub-pixels of the first display substrate to be exposed in the scanning direction.

According to some exemplary embodiments, the display mother board to be exposed further comprises a second display substrate to be exposed; the second display substrate to be exposed is adjacent to the first display substrate to be exposed in the scanning direction; there is an overlapped region between two adjacent auxiliary layers in the scanning direction, the overlapped region corresponds to a region between display regions of the first display substrate to be exposed and the second display substrate to be exposed. The plurality of scannings further comprise a second scanning, and a second scanned region is a region which is scanned in the second scanning.

With reference to FIGS. 21 and 22, the digital exposure machine further comprises: a first judging module 224, configured to judge whether the second scanned region corresponds to the overlapped region; and a first switching module 225, configured to switch the first exposure program to a second exposure program associated with the overlapped region in response to the second scanned region corresponding to the overlapped region; in the second exposure program, a distance between the display regions of the first display substrate to be exposed and the second display substrate to be exposed is set to be integer times of the scanning pitch.

According to some exemplary embodiments, the scanning module is also configured to: perform a third exposure program associated with the auxiliary layer corresponding to the second scanned region for the second scanning in response to the second scanned region not corresponding to the overlapped region, wherein in the third exposure program, the scanning pitch is set to be integer times of the pitch of two adjacent rows of sub-pixels of the first display substrate to be exposed in the scanning direction.

According to some exemplary embodiments, the scanning module is also configured to: perform the second exposure program to scan the second scanned region.

According to some exemplary embodiments, the digital exposure machine further comprises: a second judging module 226, configured to judge whether the currently scanned region corresponds to the auxiliary layer corresponding to the region to be exposed of the second display substrate to be exposed; and a second switching module 227, configured to switch the second exposure program to a fourth exposure program associated with the auxiliary layer corresponding to the currently scanned region, in response to the currently scanned region corresponding to the auxiliary layer corresponding to the region to be exposed of the second display substrate to be exposed; in the fourth exposure program, the scanning pitch is set to be integer times of the pitch of two adjacent rows of sub-pixels of the second display substrate to be exposed in the scanning direction.

According to some exemplary embodiments, the scanning module is also configured to: in response to the currently scanned region not corresponding to the auxiliary layer which corresponds to the region to be exposed of the second display substrate to be exposed, perform a fifth exposure program associated with the overlapped region corresponding to the currently scanned region to scan the currently scanned region, wherein in the fifth exposure program, the distance between display regions of the first display substrate to be exposed and the second display substrate to be exposed is set to be integer times of the scanning pitch.

The detailed descriptions above show the digital exposure machine according to the embodiments of the present disclosure. Those skilled in the art should understand that, various blocks described above may be realized in the form of software or hardware. In one embodiment, various blocks in the digital exposure machine described above may be realized through ASIC, FPGA, DSP, or other integrated circuits. However, those skilled in the art may understand that some aspects of the embodiments of the present disclosure may be equivalently implemented in an integrated circuit entirely or partly, implemented as one or more computer programs (for example, implemented as one or more programs running on one or more computer systems) running on one or more computers (for example, computer 220), implemented as one or more programs running on one or more processors (for example, implemented as one or more programs running on one or more microprocessors), implemented as firmware, or substantially implemented as any combination of the above manners, and according to the present disclosure, those skilled in the art will have the ability to design circuits and/or write software and/or firmware codes ability. In addition, those skilled in the art will recognize that the mechanism of the subject matter of the present disclosure can be distributed as various forms of program products, and regardless of the specific type of signal bearing medium actually used to perform the distribution, The exemplary embodiments of the subject matter of the present disclosure are all applicable. Examples of signal bearing medium comprise, but are not limited to: recordable medium, such as floppy disks, hard drives, compact disks (CD), digital versatile disks (DVD), digital tapes, computer storage, etc.; and transmission medium, such as digital and/or analog communication medium (for example, fiber optic cable, waveguide, wired communication link, wireless communication link, etc.).

The above are only specific implementations of the present disclosure, but the protecting scope of the present disclosure is not limited to this, any of those skilled in the art may easily conceive of changes or substitutions within the technical scope disclosed in the present disclosure, which shall be covered within the protecting scope of this disclosure. Therefore, the protecting scope of the present disclosure should be defined by the claims.

What is claimed is:

1. An exposure control method of a digital exposure machine applied to a display mother board to be exposed, the display mother board to be exposed comprising at least a first display substrate to be exposed, the first display substrate to be exposed comprising a plurality of sub-pixels arranged in an array, wherein the exposure control method comprises:
   determining a scanning direction of the digital exposure machine, wherein the plurality of sub-pixels comprise multiple rows of sub-pixels arranged in the scanning direction, and the multiple rows of sub-pixels comprise a first row of sub-pixels in the scanning direction;
   determining a starting scanning position, the starting scanning position being located on an outer side of the first row of sub-pixels in the scanning direction; and
   performing a plurality of scannings to expose a display region of the first display substrate to be exposed,
   wherein a scanning pitch for each of the plurality of scannings is integer times of a pitch of two adjacent rows of sub-pixels of the first display substrate in the scanning direction.

2. The exposure control method according to claim 1, wherein the plurality of scannings comprise a first scanning, and a first scanned region is a region which is scanned in the first scanning, and wherein before the first scanning, the exposure control method further comprises:

provelling a plurality of auxiliary layers, wherein the plurality of auxiliary layers correspond to a plurality of scanned regions respectively, and the plurality of auxiliary layers associate with a plurality of exposure programs respectively;

identifying an auxiliary layer corresponding to the first scanned region; and determining a first exposure program associated with the auxiliary layer corresponding to the first scanned region, wherein, in the first exposure program, the scanning pitch is set to be integer times of the pitch of two adjacent rows of sub-pixels of the first display substrate in the scanning direction.

3. The exposure control method according to claim 2, wherein the display mother board to be exposed further comprises a second display substrate to be exposed, the second display substrate to be exposed comprising a display region, and wherein:

the second display substrate to be exposed is adjacent to the first display substrate to be exposed in the scanning direction; and in the scanning direction, there is an overlapped region between two adjacent auxiliary layers, the overlapped region corresponding to a region between the display region of the first display substrate to be exposed and the display region of the second display substrate to be exposed.

4. The exposure control method according to claim 3, wherein the plurality of scannings further comprises a second scanning, and a second scanned region is a region which is scanned in the second scanning, and wherein after the first scanning, the exposure control method further comprises:

judging whether the second scanned region corresponds to the overlapped region; and switching the first exposure program to a second exposure program associated with the overlapped region in response to the second scanned region corresponding to the overlapped region, wherein in the second exposure program, a distance between the display region of the first display substrate to be exposed and the display region of the second display substrate to be exposed in the scanning direction is set to be integer times of the scanning pitch.

5. The exposure control method according to claim 4, wherein a third exposure program associated with an auxiliary layer corresponding to the second scanned region is used to perform the second scanning in response to the second scanned region not corresponding to the overlapped region, wherein in the third exposure program, the scanning pitch is set to be integer times of the pitch of two adjacent rows of sub-pixels of the first display substrate in the scanning direction.

6. The exposure control method according to claim 4, wherein after the first exposure program has been switched to the second exposure program, the exposure control method further comprises:

performing the second exposure program to scan the second scanned region.

7. The exposure control method according to claim 6, wherein after performing the second exposure program to scan the second scanned region, the exposure control method further comprises:

judging whether the currently scanned region corresponds to an auxiliary layer which corresponds to a region to be exposed of the second display substrate to be exposed; and switching the second exposure program to a fourth exposure program associated with the auxiliary layer corresponding to the currently scanned region in response to the currently scanned region corresponding to the auxiliary layer which corresponds to the region to be exposed of the second display substrate to be exposed, wherein in the fourth exposure program, the scanning pitch is set to be integer times of a pitch of two adjacent rows of sub-pixels of the second display substrate to be exposed in the scanning direction.

8. The exposure control method according to claim 7, wherein a fifth exposure program associated with the overlapped region corresponding to the currently scanned region is used to scan the currently scanned region in response to the currently scanned region not corresponding to the auxiliary layer which corresponds to the region to be exposed of the second display substrate to be exposed, wherein in the fifth exposure program, a distance between the display region of the first display substrate to be exposed and the display region of the second display substrate to be exposed in the scanning direction is set to be integer times of the scanning pitch.

9. The exposure control method according to claim 7, wherein after the second exposure program has been switched into the fourth exposure program, the exposure control method further comprises:

performing the fourth exposure program to scan the currently scanned region.

10. A digital exposure machine applied to a display mother board to be exposed, the display mother board to be exposed comprising at least a first display substrate to be exposed, the first display substrate to be exposed comprising a plurality of sub-pixels arranged in an array, wherein the digital exposure machine comprises:

a processor, configured to:

determine a scanning direction of the digital exposure machine, wherein the plurality of sub-pixels comprise multiple rows of sub-pixels arranged in the scanning direction, and the multiple rows of sub-pixels comprise a first row of sub-pixels in the scanning direction;

determine a starting scanning position, the starting scanning position being located on an outer side of the first row of sub-pixels in the scanning direction; and perform a plurality of scannings to expose a display region of the first display substrate to be exposed; and control a scanning module to perform the plurality of scannings with a start at the starting scanning position in the scanning direction of the digital exposure machine, to expose the display region of the first display substrate to be exposed, and the scanning module, configured to perform the plurality of scannings, wherein a scanning pitch used in each of the plurality of scannings is integer times of a pitch of two adjacent rows of sub-pixels of the first display substrate to be exposed in the scanning direction.

11. The digital exposure machine according to claim 10, wherein the plurality of scannings comprise a first scanning, and a first scanned region is a region which is scanned in the first scanning, and wherein the processor is further configured to:

provide a plurality of auxiliary layers, wherein the plurality of auxiliary layers correspond to a plurality of scanned regions respectively, and the plurality of auxiliary layers are associated with a plurality of exposure programs respectively;

identify the auxiliary layer corresponding to the first scanned region; and determine a first exposure program associated with the auxiliary layer corresponding to the first scanned region, wherein in the first exposure program, the scanning pitch is set to be integer times of the pitch of two adjacent rows of sub-pixels of the first display substrate to be exposed in the scanning direction.

12. The digital exposure machine according to claim 11, wherein the display mother board to be exposed further comprises a second display substrate to be exposed, the second display substrate to be exposed is adjacent to the first display substrate to be exposed in the scanning direction, there is an overlapped region between two adjacent auxiliary layers in the scanning direction, and the overlapped region corresponds to a region between a display region of the first display substrate to be exposed and a display region of the second display substrate to be exposed, wherein the plurality of scannings further comprise a second scanning, and a second scanned region is a region which is scanned in the second scanning; and wherein the processor is further configured to:

judge whether the second scanned region corresponds to the overlapped region; and switch the first exposure program to a second exposure program associated with the overlapped region in response to the second scanned region corresponding to the overlapped region; wherein in the second exposure program, a distance between the display region of the first display substrate to be exposed and the display region of the second display substrate to be exposed is set to be integer times of the scanning pitch.

13. The digital exposure machine according to claim 12, wherein the scanning module is further configured to:

perform a third exposure program associated with the auxiliary layer corresponding to the second scanned region for the second scanning, in response to the second scanned region not corresponding to the overlapped region, wherein in the third exposure program, the scanning pitch is set to be integer times of the pitch of two adjacent rows of sub-pixels of the first display substrate to be exposed in the scanning direction.

14. The digital exposure machine according to claim 12, wherein the scanning module is further configured to perform the second exposure program to scan the second scanned region.

15. The digital exposure machine according to claim 12, wherein the processor is further configured to:

judge whether the currently scanned region corresponds to the auxiliary layer corresponding to the region to be exposed of the second display substrate to be exposed; and switch the second exposure program to a fourth exposure program associated with the auxiliary layer corresponding to the currently scanned region, in response to the currently scanned region corresponding to the auxiliary layer corresponding to the region to be exposed of the second display substrate to be exposed; wherein in the fourth exposure program, the scanning pitch is set to be integer times of the pitch of two adjacent rows of sub-pixels of the second display substrate to be exposed in the scanning direction.

16. The digital exposure machine according to claim 15, wherein the scanning module is further configured to:

in response to the currently scanned region not corresponding to the auxiliary layer which corresponds to the region to be exposed of the second display substrate to be exposed, perform a fifth exposure program associated with the overlapped region corresponding to the currently scanned region to scan the currently scanned region, wherein in the fifth exposure program, the distance between the display region of the first display substrate to be exposed and the display region of the second display substrate to be exposed is set to be integer times of the scanning pitch.

* * * * *